(12) United States Patent
Shirakawa

(10) Patent No.: US 8,486,493 B2
(45) Date of Patent: Jul. 16, 2013

(54) COMPLEX OXIDE FILM AND METHOD FOR PRODUCING SAME, COMPOSITE BODY AND METHOD FOR PRODUCING SAME, DIELECTRIC MATERIAL, PIEZOELECTRIC MATERIAL, CAPACITOR AND ELECTRONIC DEVICE

(75) Inventor: Akihiko Shirakawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 596 days.

(21) Appl. No.: 12/159,560

(22) PCT Filed: Dec. 27, 2006

(86) PCT No.: PCT/JP2006/326090
§ 371 (c)(1),
(2), (4) Date: Jun. 27, 2008

(87) PCT Pub. No.: WO2007/074875
PCT Pub. Date: Jul. 5, 2007

(65) Prior Publication Data
US 2010/0232087 A1     Sep. 16, 2010

(30) Foreign Application Priority Data
Dec. 28, 2005   (JP) ................................ 2005-377038

(51) Int. Cl.
*B05D 3/10*     (2006.01)
*B05D 3/14*     (2006.01)

(52) U.S. Cl.
USPC ........ 427/337; 205/199; 205/200; 361/321.5; 423/598; 427/333; 427/343

(58) Field of Classification Search
USPC .................. 427/333, 337, 343; 205/199, 200; 361/321.5; 423/598
See application file for complete search history.

(56) References Cited

U.S. PATENT DOCUMENTS

| | | | |
|---|---|---|---|
| 2,218,655 A | | 10/1940 | Peterson |
| 4,078,493 A | * | 3/1978 | Miyamoto ................. 101/450.1 |
| 4,587,041 A | | 5/1986 | Uedaira et al. |
| 5,328,718 A | | 7/1994 | Abe et al. |
| 5,790,368 A | | 8/1998 | Naito et al. |
| 6,126,743 A | | 10/2000 | Saegusa et al. |
| 2002/0146365 A1 | * | 10/2002 | Cho et al. ...................... 423/598 |
| 2003/0010407 A1 | * | 1/2003 | Arai .............................. 148/276 |
| 2003/0170559 A1 | | 9/2003 | Mizutani et al. |
| 2004/0238848 A1 | * | 12/2004 | Arai .............................. 257/202 |
| 2006/0078492 A1 | | 4/2006 | Kurozumi et al. |
| 2007/0205389 A1 | | 9/2007 | Kurozumi et al. |
| 2010/0220428 A1 | | 9/2010 | Shirakawa |
| 2010/0227197 A1 | | 9/2010 | Shirakawa |

FOREIGN PATENT DOCUMENTS

| | | | |
|---|---|---|---|
| JP | 60-116119 | A | 6/1985 |
| JP | 61-030678 | A | 2/1986 |
| JP | 05-124817 | A | 5/1993 |
| JP | 05339770 | | 12/1993 |
| JP | 06211523 | | 8/1994 |
| JP | 7033579 | | 2/1995 |
| JP | 07086077 | | 3/1995 |
| JP | 9017686 | A | 1/1997 |
| JP | 09315857 | | 12/1997 |
| JP | 11031857 | A * | 2/1999 |
| JP | 11-172489 | A | 6/1999 |
| JP | 2000150295 | | 5/2000 |
| JP | 2000299247 | | 10/2000 |
| JP | 2003-206135 | A | 7/2003 |
| JP | 2005-162594 | A | 6/2005 |
| JP | 2005306728 | A | 11/2005 |
| WO | 2004/092070 | A1 | 10/2004 |

OTHER PUBLICATIONS

Yoshimura et al. "Preparation of BaTiO3 Thin Film by Hydrothermal Electrochemical Method". Japanese Journal of Applied Physics (28)11 (1989) 2007-2009.*
Non-Final Office Action dated Apr. 6, 2011 for co-pending U.S. Appl. No. 11/997,090.
Final Office Action dated Sep. 23, 2011 for co-pending U.S. Appl. No. 11/997,090.
Advisory Action dated Jan. 11, 2012 for co-pending U.S. Appl. No. 11/997,090.
Non-Final Office Action dated Jun. 13, 2012 for co-pending U.S. Appl. No. 11/997,090.
Final Office Action dated Oct. 2, 2012 for co-pending U.S. Appl. No. 11/997,090.
Notice of Allowance dated Feb. 5, 2013 for co-pending U.S. Appl. No. 11/997,090.
Non-Final Office Action dated Apr. 4, 2011 for co-pending U.S. Appl. No. 12/159,492.
Final Office Action dated Sep. 29, 2011 for co-pending U.S. Appl. No. 12/159,492.
Advisory Action dated Jan. 20, 2012 for co-pending U.S. Appl. No. 12/159,492.
Non-Final Office Action dated May 24, 2012 for co-pending U.S. Appl. No. 12/159,492.
Final Office Action dated Nov. 23, 2012 for co-pending U.S. Appl. No. 12/159,492.
"Wet-chemical synthesis of monodispersed barium titanate particles—hydrothermal conversion of $TiO_2$ microspheres to nanocrystalline $BaTiO_3$", Michael Z.-C Hu, Powder Technology 110 (2000) pp. 2-14.

* cited by examiner

*Primary Examiner* — Michael Cleveland
*Assistant Examiner* — Alexander Weddle
(74) *Attorney, Agent, or Firm* — Sughrue Mion, PLLC

(57) ABSTRACT

A complex oxide film is provided having a high relative dielectric constant and capacitance having low temperature-dependency. The film thickness can be arbitrarily controlled. A manufacturing method thereof, a composite body comprising the complex oxide film and a manufacturing method thereof are provided. The complex oxide film containing titanium element and calcium element can be obtained by forming a metal oxide film containing titanium element on a substrate surface and then allowing a solution containing calcium ion to react with the metal oxide layer. A capacitor including the complex oxide film as dielectric material and a piezoelectric element including it as piezoelectric material can be produced.

11 Claims, No Drawings

COMPLEX OXIDE FILM AND METHOD FOR PRODUCING SAME, COMPOSITE BODY AND METHOD FOR PRODUCING SAME, DIELECTRIC MATERIAL, PIEZOELECTRIC MATERIAL, CAPACITOR AND ELECTRONIC DEVICE

CROSS REFERENCE TO RELATED APPLICATION

This application is a National Stage of International Application No. PCT/2006/326090 filed on Dec. 27, 2006, claiming priority based on Japanese Patent Application No. 2005-377038, filed Dec. 28, 2005, the contents of all of which are incorporated herein by reference in their entirety.

TECHNICAL FIELD

The present invention relates to a complex oxide film and a production method thereof, a composite body and a production method thereof, a dielectric material, a piezoelectric material, a capacitor, and an electronic device. More specifically, the invention relates to a complex oxide film having a high relative dielectric constant and a production method thereof, a composite body comprising the complex oxide film and a production method thereof, a dielectric or piezoelectric material comprising the complex oxide film or composite body, a capacitor or piezoelectric element comprising the complex oxide film advantageous to improve voltage resistance, and an electronic device equipped with the same.

BACKGROUND ART

Conventionally, as small-sized capacitors, multilayer ceramic capacitors, tantalum electrolytic capacitors, and aluminum electrolytic capacitors are in practical use. Among these, a multilayer ceramic capacitor uses as a dielectric body a complex oxide such as barium titanate having a large relative dielectric constant or strontium titanate having a high voltage resistance.

Electrostatic capacitance is in proportion to relative dielectric constant and is in inverse proportion to thickness of dielectric layer and therefore, there is an increasing demand for a dielectric layer having a high relative dielectric constant, which is thin and has a uniform thickness.

As methods for forming a dielectric layer, Japanese Patent Application Laid-Open No. 60-116119 (Patent Document 1) and No. 61-30678 (Patent Document 2) disclose technique for forming a thin film of barium titanate by chemically forming a metal titanium substrate in a strong alkali solution containing barium ions. Japanese Patent Application Laid-Open No. 05-124817 (Patent Document 3: related application: U.S. Pat. No. 5,328,718) discloses a technique for forming a thin film of barium titanate on a substrate by alkoxide method.

Japanese Patent Application Laid-Open No. 2003-206135 (Patent Document 4: EP1445348) discloses a technique for forming a composite titanium oxide film, in which a metal titanium substrate is treated in an aqueous solution of alkali metal to thereby form a titanate of alkali metal on the substrate surface and is further treated in an aqueous solution containing metal ions such as ions of strontium and calcium to thereby substitute the alkali metal with metals such as strontium and calcium. Further, Japanese Patent Application Laid-Open No. 11-172489 (Patent Document 5) discloses a method for producing a barium titanate film by forming a titanium oxide film on a substrate by electrochemical approach and then subjecting the film to anodic oxidation in a barium aqueous solution.

[Patent Document 1]
Japanese Patent Application Laid-Open No. S60-116119
[Patent Document 2]
Japanese Patent Application Laid-Open No. S61-30678
[Patent Document 3]
Japanese Patent Application Laid-Open No. H05-124817
[Patent Document 4]
Japanese Patent Application Laid-Open No. 2003-206135
[Patent Document 5]
Japanese Patent Application Laid-Open No. H11-174289

DISCLOSURE OF INVENTION

Problems to be Solved by Invention

As a result of extensive studies, however, the present inventors have found out that relative dielectric constant in the dielectric layers obtained by the methods described in Patent Documents 1 to 5 are highly temperature-dependent and therefore that capacitance of capacitors using such a material is also highly temperature-dependent. Accordingly, the object of the present invention is to provide a complex oxide film having a high relative dielectric constant and a reduced temperature dependency, whose film thickness can be arbitrarily controlled, and a manufacturing method thereof, a composite body comprising the complex oxide film and a manufacturing method thereof, a dielectric or piezoelectric material comprising the complex oxide film or composite body, a capacitor or piezoelectric element comprising the complex oxide film having low temperature dependency and an electronic device equipped with the same, without involving any complicated or large scale equipment.

Means for Solving the Problems

As a result of intensive studies made with a view to solving the problems, the present inventors have found out that the object can be achieved by the following means.

That is, the present invention is as follows.

(1) A method for producing a complex oxide film containing a titanium element and calcium element, comprising a first step of forming a metal oxide film containing a titanium element and a second step of allowing a solution containing calcium ion to react with the metal oxide film.

(2) The method for producing a complex oxide film according to (1), wherein the solution containing calcium ion is an alkaline solution of pH 11 or more.

(3) The method for producing a complex oxide film according to (1) or (2), wherein the solution containing calcium ion at the second step is 40° C. or more.

(4) The method for producing a complex oxide film according to any one of (1) to (3), wherein the solution containing calcium ion contains a basic compound which becomes a gas by at least one means of evaporation, sublimation and pyrolysis at atmospheric pressure or under reduced pressure.

(5) The method for producing a complex oxide film according to (4), wherein the basic compound is an organic basic compound.

(6) The method for producing a complex oxide film according to (5), wherein the organic basic compound is tetramethylammonium hydroxide.

(7) A complex oxide film obtained by the method described in any one of (1) to (6).

(8) A method for producing a composite body having a complex oxide layer containing a titanium element and calcium element on substrate surface, comprising a first step of forming a metal oxide layer containing titanium element on substrate surface and a second step of allowing a solution containing calcium ion to react with the metal oxide layer.
(9) The method for producing a complex according to (8), wherein the substrate consists of metal titanium or an alloy containing titanium.
(10) The method for producing a complex according to (8) or (9), wherein the first step includes a step of subjecting the substrate surface to anodic oxidation.
(11) The method for producing a complex according to any one of (8) to (10), wherein the substrate is a foil having a thickness of 5 to 300 μm.
(12) The method for producing a complex according to any one of (8) to (11), wherein the substrate is prepared by sintering particles having an average particle size of 0.1 to 20 μm.
(13) A composite body, comprising a layer consisting of metal titanium or an alloy containing titanium and a complex oxide layer formed thereon which is obtained by the method described in any one of (1) to (6).
(14) A composite body obtained by the method described in any one of (8) to (12).
(15) The composite body described in (13) or (14), wherein the complex oxide layer contains a perovskite compound.
(16) A dielectric material comprising the complex oxide film described in (7).
(17) A dielectric material comprising the complex oxide film described in any one of (13) to (15).
(18) A capacitor comprising the dielectric material described in (16) or (17).
(19) An electronic device comprising the capacitor described in (18).
(20) A piezoelectric material comprising the complex oxide film described in (7).
(21) A piezoelectric material comprising the complex described in any one of (13) to (15).
(22) A piezoelectric element comprising the piezoelectric material described in (20) or (21).
(23) An electronic device comprising the piezoelectric element described in (22).

EFFECT OF INVENTION

According to the method for producing the complex oxide film according to the present invention, a complex oxide film containing titanium element and calcium element can be formed by an extremely simple method. Therefore, the present invention, which does not require large-scale equipment, enables low-cost production of the complex oxide film.

Since correlation between materials used and production conditions is clear, the thickness of the complex oxide film containing titanium element and calcium element obtained by the production method of the present invention can be easily controlled.

In a case where metal titanium or an alloy containing titanium is used as the substrate, a titanium oxide film having a controlled film thickness can be easily obtained by subjecting this substrate to anodic oxidation. By allowing this titanium oxide film to react with a solution containing calcium ion, a ferroelectric film having a controlled film thickness and high voltage resistance can be formed.

Here, by using an alkaline solution of pH 11 or more as a solution containing calcium ion, a ferroelectric film having a high crystallinity can be formed, where the relative dielectric constant is high. By using a basic compound which becomes a gas by at least one means of evaporation, sublimation and pyrolysis at atmospheric pressure or under reduced pressure as an alkali component of this alkaline solution, deterioration in film properties due to the alkali component remaining in the complex oxide film can be suppressed and therefore, a complex oxide film with stable properties can be obtained. Moreover, by setting the solution temperature to 40° C. or more, progress of the reaction can be ensured.

In the thus-obtained complex oxide film, the capacitance has extremely low temperature-dependence. By using a 5-to-300 μm-thick substrate or a substrate consisting of sintered body of particles of metal titanium or an alloy containing titanium having an average particle size of 0.1 to 20 μm, the ratio of the complex oxide film to the substrate can be increased. Thus, the complex oxide film is suitable as an electronic component in a capacitor or the like and it enables downsizing of electronic components and further reduction in size and weight of electronic devices containing such an electronic component.

BEST MODE FOR CARRYING OUT THE INVENTION

Hereinbelow, the present invention is described in detail by referring to embodiments of the invention.
(Production Method of a Complex Oxide Film and a Complex)
The production method of the complex oxide film containing titanium element and calcium element according to the present invention includes a first step of forming a metal oxide film containing titanium element and a second step of allowing a solution containing calcium ion to react with the metal oxide film.

The method for producing a complex having a complex oxide layer containing titanium element and calcium element on substrate surface includes a first step of forming a metal oxide layer containing titanium element on substrate surface and a second step of allowing a solution containing calcium ion to react with the metal oxide layer.

In the first step, a metal oxide film containing titanium element is formed. There is no particular limitation on the method for forming the metal oxide film. In the present invention, it is preferable to use a substrate and form an metal oxide film as a metal oxide layer containing titanium element on the substrate surface.

There is no particular limitation on the material of the substrate and any one of conductive material, semiconductive material and insulative material may be used depending on uses. Preferred examples of material suitable for the substrate used in capacitors include metal titanium and alloys containing titanium, which are conductive materials. A complex obtained by forming a complex oxide film as a dielectric body on surface of a conductive body, as is, can be used as an electrode of a capacitor.

There is no particular limitation on the shape of the substrate, either. The substrate may have a shape of plate or foil and further may have an uneven surface. For the substrate to be used in a capacitor, the larger the surface area per weight is, the larger the ratio of the complex oxide film against the substrate is and the more advantageous. From viewpoints of obtaining this advantage, downsizing and reducing the weight in the capacitor, it is preferable to use a foil-shaped substrate having a thickness of 5 to 300 μm, more preferably 5 to 100 μm, still more preferably 5 to 30 μm.

When a foil is used as a substrate, it is preferable that its surface area be increased by subjecting the foil to chemical etching with fluorinated acid or electrolytic etching in advance, to thereby make the surface rough.

A sintered body of metal titanium or titanium-containing alloy fine particles having an average particle size of 0.1 to 20 μm, preferably 1 to 10 μm, can be suitably used as well, so that the ratio of the complex oxide film against the substrate may be increased.

There is no particular limitation on the metal oxide containing titanium element as long as it contains titanium element. Preferred is titanium oxide. Here the term "titanium oxide" means a general formula $TiO_x \cdot nH_2O$ ($0.5 \leq x \leq 2$, $0 \leq n \leq 2$).

The thickness of the metal oxide film may be adjusted according to the thickness of the complex oxide film as desired and preferred thickness range of the oxide film is from 1 to 4000 nm, more preferably 5 to 2000 nm.

There is no particular limitation on formation method of the metal oxide film containing titanium element. In a case where a metal or an alloy other than metal titanium or an alloy containing titanium is used as a substrate, dry process such as sputtering method and plasma deposition method may be employed. From a viewpoint of low-cost production, however, it is preferable to employ wet process such as sol-gel method and electrolytic plating.

In a case where metal titanium or an alloy containing titanium is used as a substrate, similar methods may be employed and also natural oxidation, thermal oxidation or anodic oxidation of the substrate surface or the like can be employed. Preferred in the present invention is anodic oxidation in that film thickness can be easily controlled by adjusting the voltage.

In anodic oxidation, a substrate consisting of metal titanium or a titanium alloy is treated by immersing a predetermined portion of the substrate in electrolytic solution and applying a predetermined a predetermined voltage and current density thereto. In order to stabilize the liquid level of the electrolytic solution used for immersion, it is preferable to apply masking material onto a predetermined portion when the chemical formation is carried out. Masking material is not limited by materials. As masking material, general heat-resistant resins, preferably heat resistant resins or precursors thereof soluble or swellable in solvents, composition consisting of inorganic fine powder and cellulose resin (see JP-A-H11-80596) can be used. Specific examples of material usable as masking material include polyphenylsulfone (PPS), polyethersulfone (PES), cyanate ester resin, fluororesin (tetrafluoroethylene, tetrafluoroethylene-perfluoroalkylvinylether copolymer), polyimide and derivatives thereof. These materials can be dissolved or dispersed in organic solvent and therefore a solution or dispersion having an arbitrary solid concentration (that is, viscosity) suitable for coating operation can be easily prepared from these materials.

Examples of electrolytic solution include those containing at least one selected from acids and/or salts thereof such as phosphoric acid, sulfuric acid, oxalic acid, boric acid, adipic acid and salts thereof. The concentration of acid and/or salt thereof in the electrolysis solution is within a range of 0.1 to 30% by mass, preferably 1 to 20% by mass. The temperature of the electrolytic solution is generally within a range of 0 to 90° C., preferably 20 to 80° C.

After immersing the substrate in the electrolytic solution, generally, chemical formation is conducted at constant-current and then after reaching a predetermined voltage, chemical formation is conducted at constant voltage. The chemical formation at constant current and at constant voltage is generally carried out respectively under conditions of current density of 0.1 to 1000 mA/cm², voltage of 2 to 400 V, and time of 1 millisecond to 400 minutes, preferably current density of 1 to 400 mA/cm², voltage of 5 to 70 V and time of 1 second to 300 minutes.

In the subsequent second step, a solution containing calcium ion is allowed to react with the metal oxide film containing titanium element which has been formed in the first step. By this reaction, the metal oxide film containing titanium element is converted into a complex oxide film containing titanium element and calcium element. It is preferable that the complex oxide film containing titanium element and calcium element contain a perovskite compound. There is no particular limitation on the solution containing calcium ion as long as the solution contains calcium ion. The solution containing calcium ion may further contains for example, alkali earth metals such as strontium and barium and lead at a concentration (mol/l) smaller than that of the calcium.

It is preferable that the solution be an aqueous solution. Solutions of metal compounds such as hydroxide, nitrate salt, acetate salt and chloride can be used. One of these compounds may be used alone or two or more kinds of them may be used in mixture at an arbitrary mixing ratio. Examples thereof include calcium chloride, calcium nitrate, calcium acetate, strontium chloride, strontium nitrate, barium hydroxide, barium chloride, barium nitrate, barium acetate, lead nitrate, and lead acetate. Further, a compound containing at least one element selected from a group consisting of Sn, Zr, La, Ce, Mg, Bi, Ni, Al, Si, Zn, B, Nb, W, Mn, Fe, Cu and Dy may be added, such that the concentration of the element in the complex oxide film after the reaction can be less than 5 mol %.

It is preferable that the amount (mol) of calcium ion in the solution containing calcium ion used in the present invention be prepared to be from 1 to 1000 times larger than the amount (mol) of material of the metal oxide film containing titanium element.

It is preferable that the solution be an alkaline solution. Specifically, it is preferable that the pH of the solution be 11 or more, more preferably 13 or more, particularly preferably 14 or more. With a higher pH value, the complex oxide film can have a higher crystallinity. The higher the crystallinity, the higher the voltage resistance and the more advantageous.

It is preferable that the solution have an alkaline state of pH 11 or more, for example, by adding a basic compound or preferably, an organic basic compound. There is no particular limitation on the basic compound to be added. Preferred is a compound which can turn into gas at atmospheric pressure or under reduced pressure, through evaporation, sublimation and/or thermal decomposition at a temperature employed at the drying step described later or lower than that temperature. Examples thereof include TMAH (tetramethylammonium hydroxide) and choline. If an alkali metal hydroxide such as lithium hydroxide, sodium hydroxide or potassium hydroxide is added, alkali metal will remain in the obtained complex oxide film, which may cause deterioration in properties of final products to serve as functional materials such as dielectric material and piezoelectric material. The above organic basic compounds such as tetramethylammonium hydroxide are preferred in that they are easy to be removed after the reaction and the pH value is easy to be adjusted when these compounds are used.

The thus prepared solution is allowed to contact the metal oxide film containing titanium element to cause reaction while stirred and retained, generally at a temperature of 40° C. to the boiling point of the solution, preferably 80° C. to the boiling point of the solution, under normal pressure. The reaction time is generally 10 minutes or more, preferably 1 hour or more.

The obtained sample is subjected to electrodialysis, ion exchange, washing with water, permeation membrane treatment or the like if necessary, to thereby remove impurity ions therefrom, followed by drying. The drying is generally carried out at normal temperature to 150° C. for 1 to 24 hours. There is no particular limitation on the drying atmosphere and drying can be conducted in the air or under reduced pressure.

By the above method, a complex oxide film containing titanium element and calcium element or a complex having a substrate and a complex oxide film containing titanium element and calcium element can be obtained.

The complex oxide film or the complex according to the present invention can be used as a dielectric material and a piezoelectric material.

The capacitor of the present invention comprises the dielectric material. Specifically, the complex of the present invention is used as an anode of a capacitor. In preparing an anode from the complex, generally, carbon paste is attached onto the complex surface to thereby reduce electric resistance and further, silver paste is attached thereon to thereby make the complex conducting to an external lead. On this occasion, manganese oxide, conductive polymer or metal such as nickel is used in a cathode of the capacitor.

The piezoelectric element of the present invention comprises the piezoelectric material. The capacitor and the piezoelectric element can be mounted in electronic apparatuses.

The composite body (dielectric material) of the present invention has a complex oxide film serving as a dielectric layer which is thin and uniform in thickness. Moreover, the dielectric layer has a high relative dielectric constant and a low temperature-dependency. As a result, a capacitor having the composite body (dielectric material) of the present invention can be small in size and have low temperature-dependency of capacitance as well as high capacitance. Such a small-sized capacitor having a high capacitance is suitably used as a part of electronic apparatuses, especially, portable devices such as cellular phones.

EXAMPLES

Hereinafter, the present invention will be described in more detail with reference to Examples and Comparative Examples, but the present invention is not restricted thereto.

Example 1

A titanium foil (product of THANK-METAL Co., Ltd.) with purity of 99.9% having a thickness of 20 μm, having been prepared to be 3.3 mm in width, was cut into 13 mm-long rectangular pieces. One short side of each of the titanium foil pieces was fixed to a metal guide by welding. A 0.8 mm-wide line was formed with a solution of polyimide resin (product of UBE INDUSTRIES. LTD.) on a position 7 mm from the unfixed end of the foil, and dried at 180° C. for 30 minutes to thereby mask the portion. The portion of the titanium foil (an area of about 0.22 cm$^2$/surface) from the unfixed end to the above masked portion was immersed in 5% by mass phosphoric acid aqueous solution and anodic oxidation treatment was conducted by applying a voltage of 15 V with electric current density of 30 mA/cm$^2$ at 40° C. for 120 minutes, followed by pulling it up out of the phosphoric acid aqueous solution, washing with water and drying, to thereby form a titanium dioxide film on the surface of the titanium foil. The average thickness of the titanium dioxide film obtained under the conditions for the anodic oxidation was 0.15 μm. The amount of titanium dioxide per 1 cm$^2$ in the obtained titanium dioxide film, which was calculated from the average film thickness (0.15 μm), the density of the titanium dioxide (about 4 g/cm$^3$) and the formula weight of titanium dioxide (TiO$_2$=about 80), was 7.5×10$^{-5}$ mol.

A solution was prepared by dissolving calcium hydroxide (product of KOJUNDO CHEMICAL LABORATORY CO., LTD.) of moles of 20 times the amount of material (mol) of titanium dioxide layer in 20% tetramethylammonium hydroxide aqueous solution (product of Sachem Showa Co., Ltd.). The pH of the solution was 14. The titanium foil having the titanium dioxide film formed thereon was immersed in this solution at 100° C. for 4 hours to thereby cause reaction to form a complex oxide film.

The complex oxide film was subjected to X-ray diffraction analysis and it was identified to be calcium titanate having a perovskite-type structure of cubical crystal.

By TEM (Transmission Electron Microscope) observation of the cross section surface of a sample processed with an FIB apparatus, the average thickness of the sample was found out to be 0.15 μm. The temperature dependency of dielectric constant [(relative dielectric constant at 125° C.)/(relative dielectric constant at 25° C.)−1] of this complex oxide film was 2000 ppm. Therefore, the temperature dependency/° C. was 20 ppm/° C.

Comparative Example 1

A titanium foil (product of THANK-METAL Co., Ltd.) with purity of 99.9% having a thickness of 20 μm, having been prepared to be 3.3 mm in width, was cut into 13 mm-long rectangular pieces. One short side of each of the titanium foil pieces was fixed to a metal guide by welding. A 0.8 mm-wide line was formed with a solution of polyimide resin (product of UBE INDUSTRIES. LTD.) on a position 7 mm from the unfixed end of the foil, and dried at 180° C. for 30 minutes to thereby mask the portion. The portion of the titanium foil from the unfixed end to the above masked portion was immersed in 5% by mass phosphoric acid aqueous solution and anodic oxidation treatment was conducted by applying a voltage of 15 V with electric current density of 30 mA/cm$^2$ at 40° C. for 120 minutes, followed by pulling it up out of the phosphoric acid aqueous solution, washing with water and drying, to thereby form a titanium dioxide film on the surface of the titanium foil.

A solution was prepared by dissolving 0.1 mol of Ba(NO$_3$)$_2$ (barium nitrate) and 1 mol of KOH (potassium hydroxide) in 1000 ml of water. The above foil having the above-formed titanium dioxide film thereon was immersed in the solution at 100° C. for 0.5 hours, to cause reaction to thereby form a complex film. The complex oxide film was subjected to X-ray diffraction analysis and it was identified to be barium titanate having a perovskite-type structure of cubical crystal.

By TEM (Transmission Electron Microscope) observation of the cross section surface of a sample processed with an FIB apparatus, the average thickness of the sample was found out to be 0.04 μm. The temperature dependency of dielectric constant [(relative dielectric constant at 125° C.)/(relative dielectric constant at 25° C.)−1] of this complex oxide film was −40%. Therefore, the temperature dependency/° C. was 0.4%/° C.

In Example 1, a case using the complex oxide film as a dielectric material in a capacitor was described. The complex oxide film, however, can be used as a piezoelectric material for a piezoelectric element.

The invention claimed is:

1. A method for producing a complex oxide film containing a titanium element and calcium element, comprising a first step of forming a metal oxide film containing a titanium element by anodic oxidation, followed by washing with water and drying, and a second step of allowing a solution containing calcium ion to react with the metal oxide film, and
wherein the first step of forming a metal oxide film by anodic oxidation is performed at a temperature from 0 to 90° C. and the second step for producing a complex metal oxide film is performed at atmospheric pressure.

2. The method for producing a complex oxide film according to claim 1, wherein the solution containing calcium ion is an alkaline solution of pH 11 or more.

3. The method for producing a complex oxide film according to claim 1, wherein the second step of allowing the solution containing a calcium ion to react with the metal oxide film is performed in a temperature range from 40° C. to the boiling point of the solution.

4. The method for producing a complex oxide film according to claim 1, wherein the solution containing calcium ion contains a basic compound which becomes a gas by at least one means of evaporation, sublimation and pyrolysis at atmospheric pressure or under reduced pressure.

5. The method for producing a complex oxide film according to claim 4, wherein the basic compound is an organic basic compound.

6. The method for producing a complex oxide film according to claim 5, wherein the organic basic compound is tetramethylammonium hydroxide.

7. A method for producing a composite body having a complex oxide film containing a titanium element and calcium element on a substrate surface, comprising a first step of forming a metal oxide film containing a titanium element on the substrate surface by anodic oxidation, followed by washing with water and drying, and a second step of allowing a solution containing calcium ion to react with the metal oxide film, and
wherein the first step of forming a metal oxide film by anodic oxidation is performed at a temperature from 0 to 90° C. and the second step for producing a complex metal oxide film is performed at atmospheric pressure.

8. The method for producing a complex body according to claim 7, wherein the substrate consists of metal titanium or an alloy containing titanium.

9. The method for producing a complex body according to claim 7, wherein the first step includes a step of subjecting the substrate surface to anodic oxidation.

10. The method for producing a complex body according to claim 7, wherein the substrate is a foil having a thickness of 5 to 300 μm.

11. The method for producing a complex body according to claim 7, wherein the substrate is prepared by sintering particles having an average particle size of 0.1 to 20 μm.

* * * * *